US 7,043,412 B1

(12) United States Patent
Schultz

(10) Patent No.: US 7,043,412 B1
(45) Date of Patent: May 9, 2006

(54) METHOD AND APPARATUS FOR PREDICTING VEHICLE AIR SYSTEM PERFORMANCE AND RECOMMENDING AIR SYSTEM COMPONENTS

(75) Inventor: Paul Schultz, Brunswick, OH (US)

(73) Assignee: Bendix Commercial Vehicle Systems LLC, Elyria, OH (US)

(*) Notice: Subject to any disclaimer, the term of this patent is extended or adjusted under 35 U.S.C. 154(b) by 891 days.

(21) Appl. No.: 09/667,924

(22) Filed: Sep. 22, 2000

(51) Int. Cl.
G06G 7/48 (2006.01)

(52) U.S. Cl. .................. 703/8; 417/44.9; 417/292; 706/45

(58) Field of Classification Search ............ 703/8; 706/45; 417/292, 44.9
See application file for complete search history.

(56) References Cited

U.S. PATENT DOCUMENTS 5,795,134 A * 8/1998 Malecha ............... 417/44.9
6,036,449 A * 3/2000 Nishar et al. ............ 417/292
6,477,518 B1 * 11/2002 Li et al. ................ 706/45
6,682,459 B1 * 1/2004 Knight ................. 477/183

OTHER PUBLICATIONS

Keith L. Curtner; Patrick J. O'Neill, "Simulation-Based Features of the Compressed Air System Description Tool,,XCEED", Building Simulation '97, vol. 9, No. 2, Dec. 1997.*

* cited by examiner

Primary Examiner—Kamini Shah
Assistant Examiner—Herng-der Day
(74) Attorney, Agent, or Firm—Calfee, Halter & Griswold LLP

(57) ABSTRACT

A method of designing a vehicle air system is provided. This method includes the use of a computer to simulate operation of a proposed vehicle air system over a time period, wherein the proposed vehicle air system comprises an air compressor and a pneumatically operable device, and wherein the step of simulating operation of a proposed vehicle air system over a time period includes: simulating selective operation of the air compressor to add air to the proposed vehicle air system; and simulating selective operation of the pneumatically operable device to exhaust air from the proposed vehicle air system. The computer is then used to calculate a duty cycle of the air compressor over the time period and to output the duty cycle.

15 Claims, 5 Drawing Sheets

METHOD AND APPARATUS FOR PREDICTING VEHICLE AIR SYSTEM PERFORMANCE AND RECOMMENDING AIR SYSTEM COMPONENTS

BACKGROUND OF THE INVENTION

The present invention relates to a method and apparatus that are used by vehicle air system designers to predict air system performance in a motor vehicle. The method and apparatus also provide the air system designer with a recommendation for air system components to optimize air system performance for a particular vehicle and its expected vocation. The present invention is described herein with particular reference to vehicle air systems, but those of ordinary skill in the art will recognize that the invention has wider application and can be used to predict performance of air systems found in applications other than vehicles without departing from the overall scope and intent of the invention. It is intended that the method and apparatus of the present invention relate to both vehicle and non-vehicle air systems.

Heretofore, a designer of a vehicle air system has been forced to utilize experience, rules of thumb, past performance observations, and other information in the selection of vehicle air system components such as air compressors, air dryers, filters, and the like. Several developments have made this approach highly undesirable. Pneumatic component manufacturers have demanded that their components be supplied with cleaner and drier air to increase performance. Selection of sub-optimal compressors and dryers results in air that is too moist and/or dirty owing to a compressor duty cycle that is above a recommended threshold.

On the other hand, in an effort to ensure an ample supply of clean, dry compressed air, the vehicle air system designer may select an air compressor and drier combination that is overly capable for a given application. This, then, needlessly increases the cost and weight of the vehicle.

Also, modern vehicles are being equipped with an ever increasing number of pneumatic components, and some of these additional components demand especially large amounts of compressed air from the vehicle air system. Many designers are simply unfamiliar with these devices and the load that they can potentially exert on a vehicle air system.

Furthermore, conventional methods of selecting air system components for vehicles do not account for variations in use by identical vehicles, i.e., identical buses may have different air system requirements depending upon road conditions, driving conditions, climate, and other variables. Thus, while a designers selection of an air compressor and dryer combination may be appropriate for some potential applications of a vehicle, it may be inappropriate for other potential applications of the same vehicle.

In light of the foregoing specifically noted deficiencies and others associated with convention air system design, a need has been identified for a new and nonobvious method and apparatus for predicting vehicle air system performance and recommending air system components.

SUMMARY OF THE INVENTION

In accordance with a first aspect of the present invention, a method of designing a vehicle air system includes using a computer to simulate operation of a proposed vehicle air system over a time period. The proposed vehicle air system includes an air compressor and a pneumatically operable device. The computer is used to calculate a duty cycle of the air compressor over the time period, thereafter outputs the duty cycle. This method also includes the step of inputting vehicle use information that describes expected operation conditions of the proposed vehicle air system over the time period, wherein the step of simulating selective operation of the pneumatically operable device to exhaust air from the proposed vehicle air system includes simulating operation of the pneumatically operable device at intervals that vary depending upon the input vehicle use information.

In accordance with another aspect of the invention, a method for predicting performance of a vehicle air system includes inputting into a computer data that simulate a proposed vehicle air system, including: (i) data that describe a simulated air compressor of the proposed vehicle air system; and, (ii) data that describe a simulated pneumatically operable device of the proposed vehicle air system. The computer is used to simulate operation of the proposed vehicle air system over a simulation time period. The simulation operation includes: (i) selectively simulating exhaustion of air from the proposed vehicle air system in response to simulated operation of the pneumatically operable device; and, (ii) selectively simulating addition of air to the proposed vehicle air system in response to simulated operation of the air compressor. Data that describe the simulated operation of the proposed vehicle air system are output.

In accordance with another aspect of the present invention, a method for predicting vehicle air system performance includes inputting data that describe a proposed vehicle air system including at least an air compressor and at least one pneumatically operable device. Input data related to a capacity of the proposed air compressor to supply air to the proposed vehicle air system are received, along with input data related to a cut-in pressure of the proposed vehicle air system below which the proposed compressor is considered operative to add air to the proposed vehicle air system. Input data related to a cut-out pressure of the proposed vehicle air system are also received and describe a pressure above which operation of the proposed compressor to add air to the proposed vehicle air system is considered terminated. Input data are received that are related to a usage rate at which the at least one pneumatically operable device depletes air from the proposed vehicle air system when operated. Input data are received that are related to the frequency of operation of the pneumatically operable device. A period of operation for the proposed vehicle air system is determined, and operation of the proposed vehicle air system is simulated over the period of operation by: (i) calculating data that represent air depleted from the proposed vehicle air system based upon the usage rate and frequency of operation of the at least one pneumatically operable device; and, (ii) calculating data that represent air added to the proposed vehicle air system by the proposed air compressor based upon the cut-in and cut-out pressures. The compressor duty cycle is then determined.

One advantage of the present invention resides in the provision of a new and nonobvious method and apparatus for predicting vehicle air system performance and recommending air system components.

Another advantage of the present invention is found in the provision of a method and apparatus for predicting vehicle air system performance and recommending air system components, wherein a designer inputs proposed air system components and receives an analysis of the performance of the proposed components for a particular vehicle and vehicle application.

A further advantage of the present invention results from the provision of a method and apparatus for predicting vehicle air system performance and recommending air system components, wherein the impact of accessories, brake system variations, driving habits, climate, and road conditions on the air system can be accurately predicted.

Still another advantage of the present invention resides in the provision of a method and apparatus for predicting vehicle air system performance and recommending air system components, wherein an air system proposed by a designer is analyzed on a period-by-period (e.g., minute-by-minute) basis to assess its likely performance under actual vehicle use conditions.

Still other benefits and advantages of the present invention will become apparent to those of ordinary skill in the art to which the invention pertains upon reading and understanding the following specification.

BRIEF DESCRIPTION OF THE DRAWINGS

The invention comprises a variety of components and arrangements of components, and a variety of steps and arrangements of steps, preferred embodiments of which are disclosed herein with reference to the accompanying drawings that form a part of the specification and wherein.

DETAILED DESCRIPTION OF PREFERRED EMBODIMENTS

Figure 1:
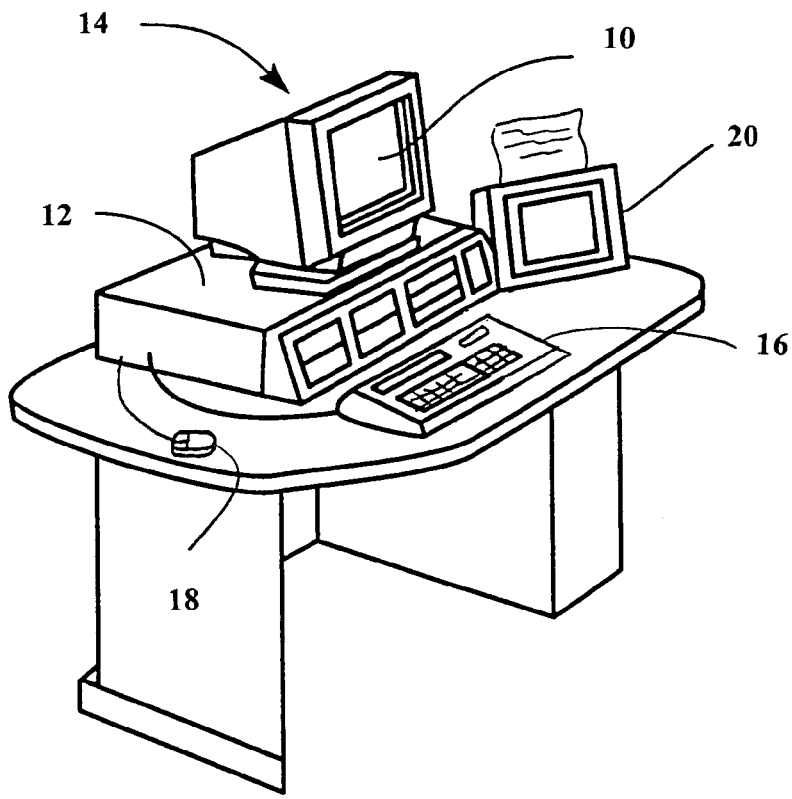
FIG. 1 diagrammatically illustrates an apparatus for predicting vehicle air system performance and recommending air system components.

Referring now to the drawings, wherein the showings are for purposes of disclosing preferred embodiments of the invention and not for limiting the invention in any way, an apparatus formed in accordance with the present invention is illustrated in FIG. 1. The apparatus preferably comprises a general purpose computer 10 programmed to carry out a method for predicting vehicle air system performance and recommending air system components in accordance with the present invention. In a most preferred embodiment, the general purpose computer 10 is an IBM compatible personal computer of modern design, having at least a Intel Pentium® class microprocessor with at least 16 megabytes of random access memory, a mass storage disk drive 12 having at least 1 gigabyte of capacity, a color video monitor 14, a keyboard 16, a pointing device such as a mouse 18, and a printer 20. Other more or less powerful computer systems may be used, and other types and brands of computer systems can be employed (e.g., Apple® brand computer systems), without departing from the overall scope and intent of the present invention.

Figure 2:
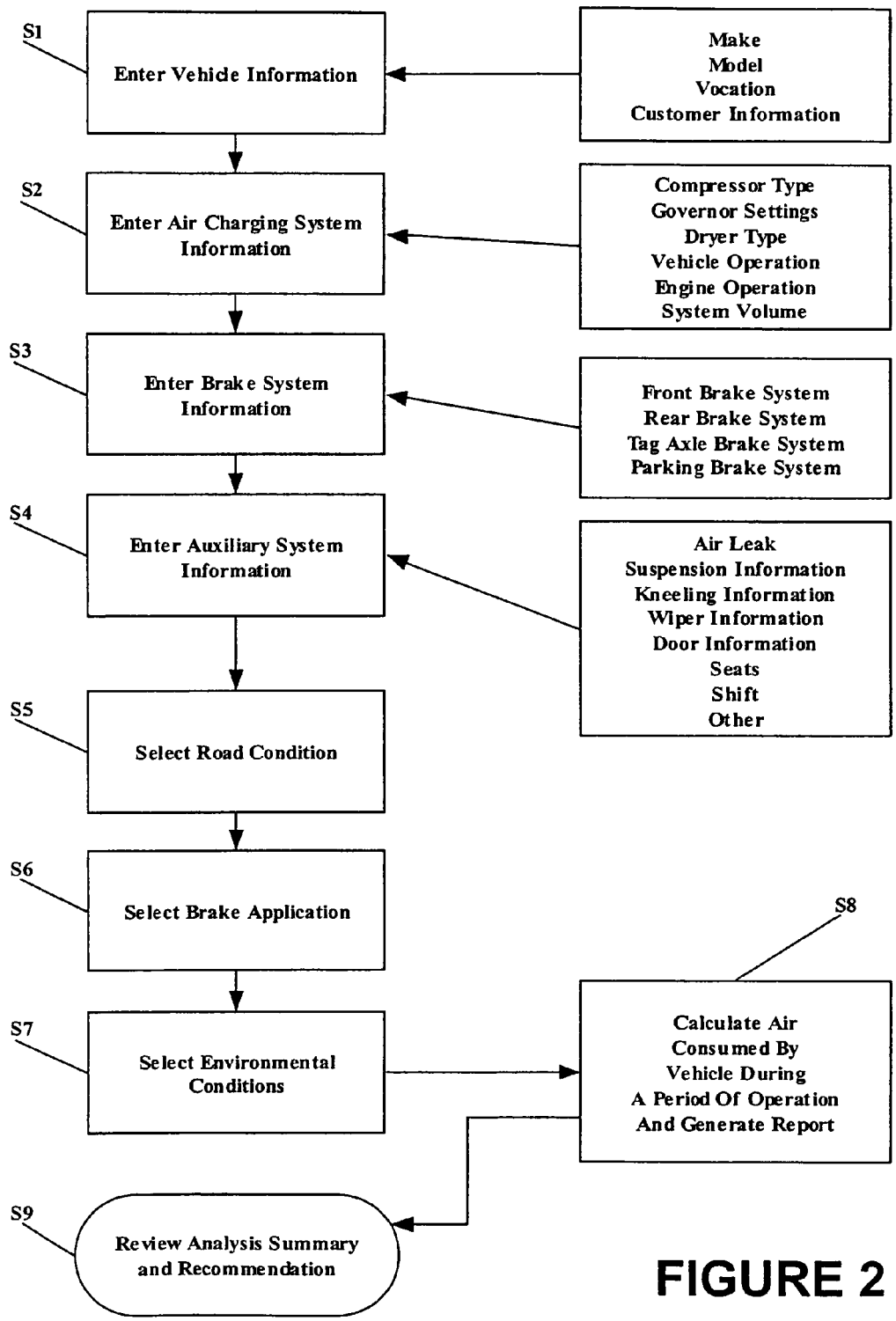
FIG. 2 is a flow chart that illustrates a method for predicting vehicle air system performance and recommending air system components in accordance with the present invention.

Referring now to FIG. 2, a method for predicting vehicle air system performance and recommending air system components in accordance with the present invention is disclosed. The method is preferably carried out in the general purpose computer 10 after same has been programmed in accordance with the method.

In a first step S1, a user of the computer 10 enters general information concerning the vehicle on which the proposed air system is to be used. This is merely for identification purposes and includes information such as, e.g., the make, model, vocation, and anticipated customer for the vehicle. This information is stored in the computer 10.

In a second step S2, the user enters into the computer 10 information about the proposed air charging system of the vehicle. Preferably, this includes information on a proposed compressor, information on a proposed air dryer, information on the engine that is to drive the proposed compressor, the volume of the air system, and information on the expected vehicle operation. Each of these is described below in further detail.

In step S2, a user must supply information on a proposed air compressor. Most preferably, the user simply uses the pointing device 18 of the computer 10 to select a compressor from a predefined list. For each compressor that may be selected by the user, the computer 10 has access to a database or the like stored on the mass storage device 12 that supplies the computer 10 with operational characteristics of the compressor. For example, the output of each compressor at different speeds of the driving engine must be known so that this information can be used to derive the compressor's input to the air system of the vehicle as described below. Furthermore, after a compressor is selected from the compressor list, the user must input a cut-in pressure and a cut-out pressure for the selected compressor that govern cycling-on and cycling-off of the compressor. The cut-in pressure is the pressure of the vehicle air system where the selected air compressor will cycle "on" and build air into the vehicle air system. Conversely, the cut-out pressure is the pressure of the vehicle air system where the selected compressor will cycle "off" and no longer build air into the vehicle air system.

As noted, the user must also select a type of air dryer from a predefined list or may enter "other" for a dryer not set forth on the list. Again, for each air dryer on the predefined list, the mass storage device 12 of the computer contains information concerning the purge volume of the dryer and source of purge air, i.e., from a volume held by the dryer or from the vehicle air system. The purge volume is the amount of air passed through the dryer to purge moisture therefrom. This purge air can be taken from the vehicle air system or from another reservoir dedicated for this purpose. If the user selects "other" for a proposed air dryer, the user will be required to supply all of the foregoing, i.e., the purge volume of the air dryer, or if the dryer purges from the vehicle air system, the vehicle air system pressure drop caused by each purge operation.

Also in step S2, the user will be required to enter information concerning the expected operation of the vehicle. This preferably includes: (1) the average time between vehicle stops (e.g., 10 minutes or 1 hour (60 minutes); (2) the average number of stops per day (e.g., 40); (3) the average number of parking brake applications per day (e.g., 6); and, (4) the average number of brake applications between stops (e.g., 10). From items (1) and (2) above, the vehicle operation duration is derived, e.g., a stop every 10 minutes with 40 stops per day=400 minutes of operation=6.67 hours of operation per day. Item (3) is used to account for air used by the vehicle air system during parking brake application and release. Item (4) accounts for air consumed from the vehicle air system by brake activity between complete vehicle stops, e.g., light brake applications for speed control, cornering, and the like.

A user must also supply information on the vehicle engine that is used to drive the air compressor. Preferably, the user selects an engine type from a predefined list and indicates whether the engine is normally aspirated or turbo charged. If turbo charged, the user must enter the boost pressure. Regardless of the engine selected, the user must enter an average engine speed (RPM) at which the engine is operated between stops. This information is used to determine the average air building ability of the air compressor selected by the user.

A user is also prompted to enter a total volume of the vehicle air system. A user can simply select a "minimum volume" button using his/her pointing device 18. When this minimum volume button is selected, a minimum system volume value (as prescribed by air system safety standards) is used in the analysis described below, wherein the minimum volume is equal to the volume of the vehicle braking system.

A step S3 of the subject method requires a user to enter information concerning the braking system of the vehicle being analyzed. Specifically, the user is required to enter relevant information concerning the front, rear, tag axle (if vehicle is equipped with a tag axle), and parking brake systems. In a most preferred embodiment, for each of the applicable front, rear, and tag axle brake systems, the user must enter a chamber type (preferably selected from a predefined list including, e.g., Type 6, 9, 12, 16, 20, 24, 30, and 36 chambers). For each chamber type set forth in the predefined list, an associated chamber volume is stored on the disk drive or other mass storage device 12 of the computer apparatus 10. After a user selects one of the chamber types from the list, the associated chamber volume value is displayed to the user, and the user can override the displayed value if desired. Also, a user can select chamber type "other" from the predefined list, in which case the user must enter the associated chamber volume. The user is also prompted to enter the length and diameter of the brake lines leading to the selected type of chambers. Finally, the user is prompted to enter the number of the selected type chambers found on the axle in question. From the foregoing, the total brake system air volume for each axle is derived and displayed to the user. Also, once the user has entered all requested values for all axles, a total brake system air volume is derived and displayed to the user.

The user is then required to enter information concerning the parking brake system connected to the vehicle air system. In particular, the user must indicate whether the vehicle is equipped with a spring brake parking brake or with a DD-3 based parking brake system. These place different air demands on the vehicle air system.

In a step S4, the user also must input into the apparatus 10 information relating to all auxiliary systems connected to the vehicle air system. Auxiliary systems include, e.g., suspension, kneeling, wiper, door, seats, shift, and other similar air-powered vehicle systems. A pre-defined list of potentially used auxiliary devices/systems is displayed to the user, and the user can use the pointing device 18 to select those that are found on the proposed vehicle air system being analyzed. For each auxiliary system selected, the user is prompted to enter additional information so that the demand on the vehicle air system for each auxiliary system can be determined.

One of the available choices on the predefined list of auxiliary devices/systems is entitled "air leak" or the like. By selecting this, the user can input information concerning the expected amount of air loss from the vehicle air system due to leak conditions. It is preferred that this air loss due to air leakage be treated as an auxiliary device/system, with identical inputs as described below.

Specifically, for each auxiliary system selected to be included in the analysis, the user is required to enter at least: (1) the average amount of air consumed by the auxiliary system/device during its operation; and (2) the volume from which the air loss occurs. Concerning item (1), the average air consumed, the user can enter this value using one of three different parameters—(a) pressure/volume in terms of pounds per square inch (psi) or the like; (b) flow rate in terms of cubic feet per minute (cfm) or the like; or, (c) a pressure drop rate in terms of psi/minute. Thus, regardless of the air usage rate units known by the user for a particular auxiliary system/device, the user will be able to enter this information without performing a units conversion operation. Concerning item (2) above, the volume from which the air loss occurs, the user can also select one of three predefined volumes—(a) the overall vehicle air system volume; (b) a separate volume (i.e., reservoir) of the auxiliary system/device; or, (c) both the overall vehicle air system volume and a volume maintained by the auxiliary system/device. In the cases (b) and (c), where the air loss occurs at least partially from the auxiliary system/device, the user is prompted to enter the auxiliary system/device volume.

For an auxiliary door system, in particular, the user must indicate if the vehicle is equipped with a brake interlock system, i.e., a system that automatically operates at least part of the vehicle brake system when the door operated. If the user answers "yes," the user must also indicate whether the front, rear, or both brake systems are activated for the interlock operation, and the pressure at which the brake system is activated.

Those of ordinary skill in the art will recognize that air usage by auxiliary systems/devices can be measured in different ways. For a suspension system, the preferred air usage rate is air used per inch of suspension travel. For an auxiliary wiper system, the preferred air usage rate is expressed in terms of air used per minute of operation. For a kneeling, door, shift system, or other system where a discrete event is carried out by the auxiliary system, the preferred air usage rate is the air used per event, i.e., air used per kneeling cycle (down/up), air used per door activation cycle (open/close), and air used per shift, respectively. Thus, for these auxiliary system where a discrete event occurs, the user is also prompted to enter the average number of events per day expected for the vehicle being analyzed.

If the user desires to include a type of auxiliary system/device that is not set forth on the predefined list of same presented to the user, the user can use the pointing device 18 to select "other" and is prompted to supply all of relevant information noted above. Furthermore, the user can assign a name to the "other" selection so that it will thereafter form a part of the predefined list of auxiliary devices/systems presented to the user. Examples of other auxiliary devices that may not be found in the predefined list include air starters, lift mechanisms, and the like.

As noted above, step S4 also comprises supplying information about the expected air leakage or loss in the vehicle air system being analyzed. The information supplied is identical to the information supplied for other auxiliary systems not of the discrete event type. A rule of thumb for this loss is 1 psi/minute, and this value can be supplied as a default if desired.

In a step S5, the user enters information concerning the type of road conditions expected to be encountered by the vehicle being analyzed. Specifically, the user is preferably prompted to select one of at least three predefined values for the average expected amount of suspension displacement, e.g., 0.5 inch, 1.0 inch, or 1.5 inch. This parameter describes the average amplitude of the suspension travel. Preferably, the user is also prompted to select one of at least three different values that describe the average number of suspension activations per hour, e.g., 2 (smooth roads), 10 (average roads), or 60 (rough roads). This parameter describes the frequency of suspension activations. This information is used to determine air loss due to suspension activations and seat activations.

A step S6 comprises the user entering information into the apparatus 10 that describes typical brake application pressure. Preferably, the user is prompted to select one of at least three different predefined average brake application pressures, e.g., "Hard" (22 psi or 1.5 bar), "Medium" (15 psi or 1.0 bar), or "Light" (10 psi or 0.7 bar). This, of course, will affect the amount of air used by the primary brake system of the vehicle.

A step S7 comprises the user entering information into the apparatus 10 that describes typical environmental conditions expected for the vehicle. Preferably, here again, the user is prompted to select one of at least three different average predefined environmental descriptions, e.g., "Wet" (wipers operated 75% of vehicle operation time), "Normal" (wipers operated 30% of vehicle operation time), or "Dry" (wipers operated only 1% of vehicle operation time). This parameter will affect the amount of air used by the auxiliary air wiper system, if present on the vehicle according to information supplied by the user concerning auxiliary devices/systems as noted above.

A step S8 comprises using the computer 10 in accordance with the method described herein to calculate the air consumed by the proposed vehicle air system being analyzed during a typical period of operation, and generating a summary report of same, including recommended modifications, if any are required, to the vehicle air system components proposed by the user. Finally, a step S9 comprises the user reviewing the analysis and summary report.

Figure 3A:
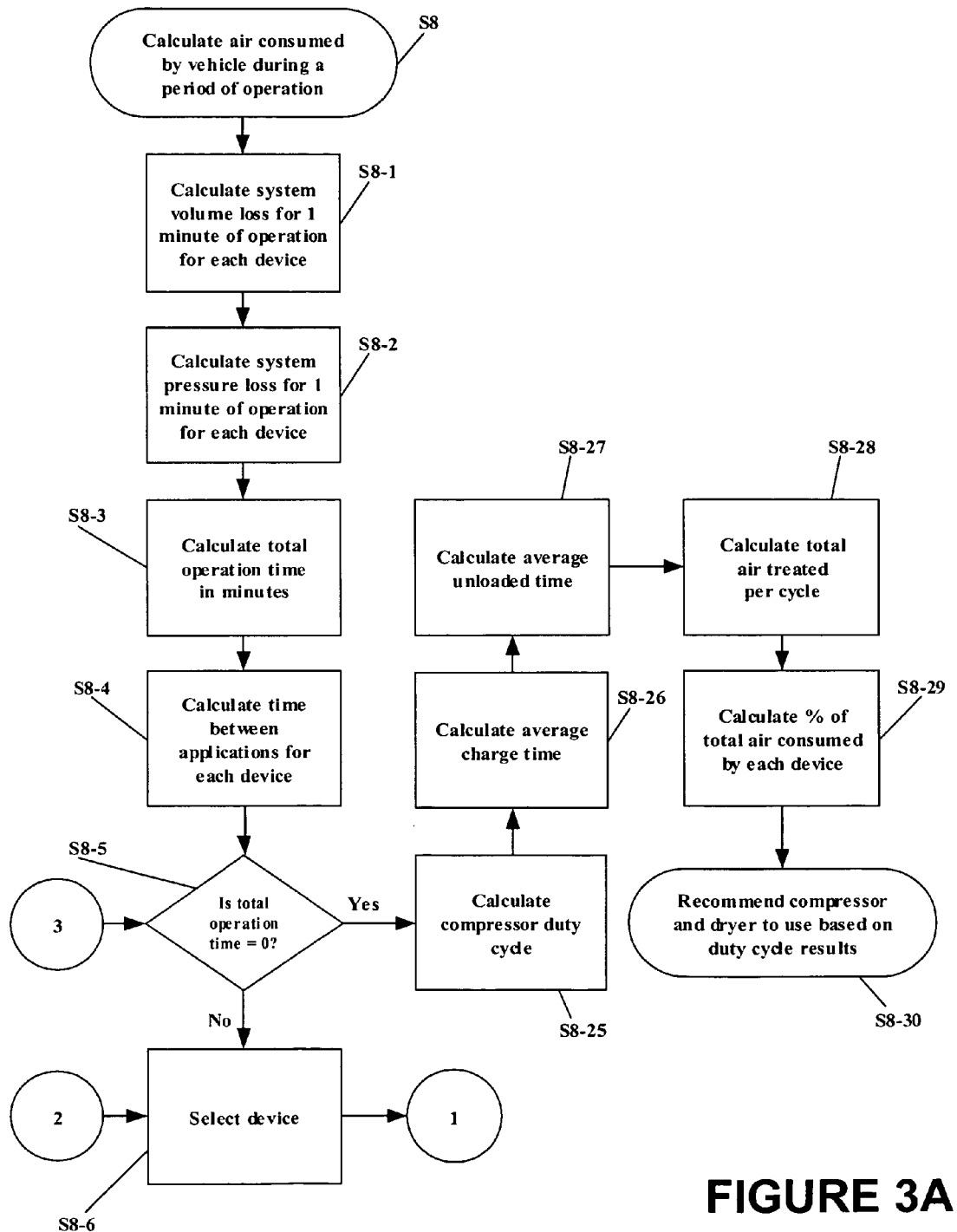
FIGS. 3A and 3B together define a flow chart that discloses a method of simulating use of a proposed vehicle air system, calculating the duty cycle and other performance characteristics of the proposed air system, and recommending air system components in accordance with the present invention; and, FIG. 4 illustrates a preferred output page resulting from the method in accordance with the present invention.
Figure 3B:
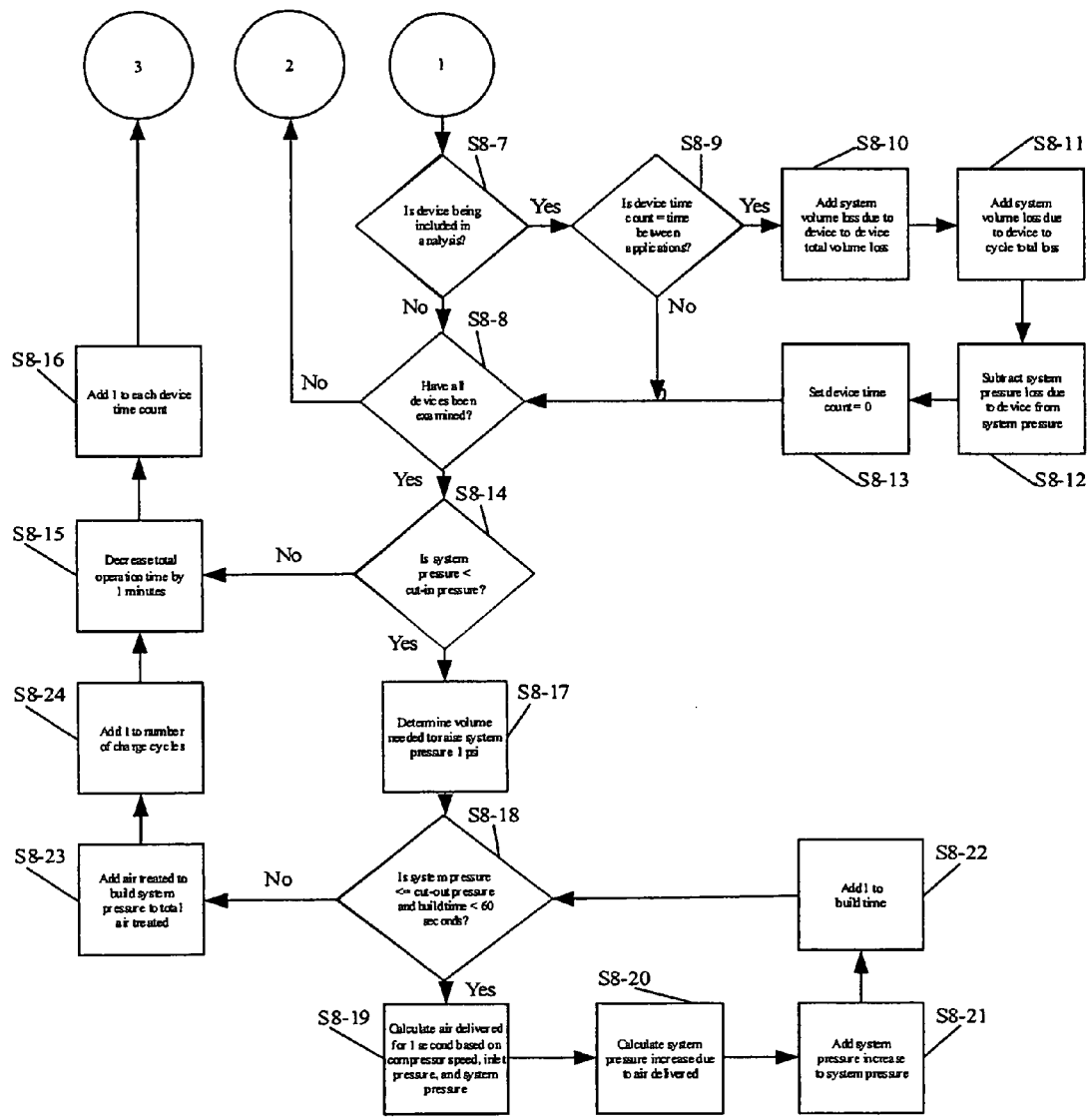

Referring now to FIGS. 3A and 3B, a preferred implementation of step S8, via sub-steps S8-1 through S8-30, is disclosed. In general, all information input by a user is used to simulate a "day in the life" of the proposed vehicle air system. This, then, allows information such as the compressor duty cycle, total number of dryer purges, the air treated per cycle, the volume of air used by each device, and the percent of air used by each device to be determined. Although the following analysis as described herein uses minutes as the unit of time, those possessed of ordinary skill in the art will recognized that other time periods can be used without departing from the overall scope and intent of the present invention. Furthermore, while the following process is described in detail, conventional flag and counting variables and other conventional computer programming techniques are omitted for clarity and ease of appreciating the present invention.

Steps S8-1 and S8-2 comprises calculating system volume and pressure loss, respectively, for one minute of operation (assumed to be one device activation) of each device that forms a part of the vehicle air system, i.e., the brake, suspension, and auxiliary systems, described above. The sub-steps S8-1,S8-2 calculate the amount of air used per minute or by each activation of each device and derive the volume and pressure loss from the vehicle air system resulting from the air loss. These values for each device are stored on the mass storage device 12 in a look-up table or the like for later use as needed. For the devices where a discrete operation is performed, i.e., a shift, a kneel/unkneel cycle, door open/close cycle, a parking brake application, a brake application for vehicle stop, etc., it is assumed that one cycle is carried out in a minute. For the brakes, the air used will depend upon the typically brake application pressure entered by the user in step S6. For the suspension and seats, in step S4, the user has entered the amount of air used per inch of suspension travel and per seat activation and, in step S5, the user has entered the average amplitude of suspension travel and the average frequency of suspension activation. From this information, the air used by the suspension and seat systems during one minute of operation is derived. For wipers, air leak, and other auxiliary devices, the volume and pressure loss resulting from one minute of operation is derived from or directly available from the usage rate information entered by the user in step S4.

A step S8-3 comprises calculating, in minutes, the total operational time of the vehicle on which the air system is in use. As noted above, this is preferably derived based upon the number of stops, and the time between stops.

A step S8-4 calculates the time, in minutes, between applications for each device. Various methods are used to determine this value. For devices where there is a discrete operation, a brake application for a vehicle stop, a brake application for speed control, a parking brake application, a kneeling cycle, a door open/close cycle (with or without brake interlock), or the like, the time between applications of the device is determined by equally spacing the estimated number of events over the calculated operation time of the vehicle, e.g., if the vehicle is operated for 100 minutes per day, with 10 door cycles per day, the time between door cycles is calculated as 10 minutes. For the suspension, the step S8-4 calculates the time between suspension activations based upon the input of suspension activations per hour input by the user in step S5. For wipers, the step S8-4 derives the time between applications for the wipers based upon the environmental conditions input by the user in step S7, e.g., for "wet" conditions the wipers are assumed to be operated 75% of the vehicle operation time, for "normal" conditions the wipers are assumed to be operated for 30% of the vehicle operation time, and for "dry" conditions the wipers are assumed to operate only 1% of the vehicle operation time. Thus, for example, if the vehicle operation time is derived as 100 minutes in step S8-3, and "normal" environmental conditions are input by the user in step S7, there will be 30 wiper applications during the 100 minutes of operation and these are assumed to be evenly spaced over the vehicle operation duration, i.e., one wiper application every three and one-third minutes (normal number rounding is used to set three and one-third minutes equal to 3 minutes).

As noted, the total operation time of the vehicle is calculated in step S8-3. This "total operation time" variable is decremented during the analysis described below until it reaches zero. Specifically, a step S8-5 checks to see if the total operation time of the vehicle equals zero. If not, the analysis continues with a step S8-6 that selects a device from a list of all possible devices. A step S8-7 determines if the device selected in step S8-6 has been included on the system proposed by the user. If not, a step S8-8 checks to see if the step S8-6 has selected every possible device and, if not, control returns to step S8-6 for selection of another potentially included device.

If, on the other hand, the step S8-7 determines that the user has included the selected device in the analysis, control passes to step S8-9 that determines if the selected device is due for an activation according to the time between its applications derived in step S8-4 above. Specifically, each device is associated with a respective variable "device time" that is initially set at zero and thereafter compared to the time between applications determined for that device in step S8-9. If the device is not due to operate, i.e., the device time has not yet reached the value of the time between applications for the device, control returns to step S8-8. However, if the selected device is due to operate, a step S8-10 obtains the device's system volume loss (determined in step S8-1) and adds this to a running total variable (referred to herein as "device total volume loss") that represents the air volume loss for the minute of operation being analyzed. Furthermore, a step S8-11 adds the device's system volume loss to a second running total variable (referred to herein as "cycle total loss") that represents air volume loss over the entire operation time of the vehicle. A step S8-12 subtracts the pressure loss from operation of the device from the variable "system pressure"(which defaults to the compressor cut-out pressure at the beginning of step S8). Thus, the pressure of the vehicle air system is always known. The step S8-13 re-sets the device time variable to zero (the device time variable for each device defaults to zero at the beginning of step S8) which is, again, the variable that determines whether the device is to be operated at a given vehicle operation time. Finally, control returns to step S8-8 which determines if, for a particular minute of the vehicle's operation, all possible devices have been examined. If not, control returns to step S8-6, otherwise, control passes to step S8-14.

The step S8-14 compares the variable "system pressure" to the compressor cut-in pressure input by the user in step S2. If the system pressure is not less than the cut-in pressure, the vehicle air system does not require the compressor to build air into the system, so control passes to step S8-15 that decrements the "total operation time" variable by one minute and then to step S8-16 that increments the "device time" variable associated with every included system device. Control then returns to step S8-5 described above.

If, on the other hand, step S8-14 determines the pressure of the vehicle air system is less than the cut-in pressure, control passes to step S8-17 that determines what volume of air the compressor must supply to add 1 psi to the vehicle air system. A step S8-18 compares the system pressure to the cut-out pressure and also compares a variable "build time" (which is reset to zero as control passes from step S8-14 to S8-17) to 60 seconds. The variable "build time" is a running total, in seconds, of the time a compressor has been building air into the vehicle air system for a given air charge cycle. If the system pressure is less than the cut-out pressure and the variable "build time" is less than 60 seconds, a step S8-19 determines how much air is delivered from the compressor to the vehicle air system for one second of compressor operation based upon the compressor speed (derived from the average engine RPM and other engine information entered by the user in step S2), the compressor inlet pressure, and the present pressure of the vehicle air system. A step S8-20 determines the system pressure increase that would result from addition of the air volume determined in step S8-19 to the system volume. A step S8-21 adds the pressure increase determined in step S8-20 to the system pressure, a step S8-22 increments the build time variable by 1 second, and control returns to step S8-18.

When the step S8-18 determines that the system pressure has reached the cut-out pressure or the build time variable has reached 60 seconds, control passes to step S8-23 which adds the total volume of air delivered by the compressor during the build time (the build time is either a 60 second period or less if the cut-out pressure is reached before 60 seconds of build time is reached) to a variable "total air treated" which is initially set to zero at the beginning of step S8. The "total air treated" variable represents the total volume of air delivered by the compressor over the total operation time of the vehicle. A step S8-24 increments a "charge cycles" variable that initially is set to zero at the beginning of step S8. The variable "charge cycles" represents the number of times the compressor has been used to build air into the vehicle air system over the total operation time of the vehicle. Control then passes to step S8-15 described above. Also, the value of the variable "build time" at the end of each compressor charge cycle is added to a variable "total build time" before being reset to zero for later duty cycle and average charge time calculations.

Eventually, the total operation time of the vehicle will equal zero and the step S8-5 will transfer control to step S8-25 that calculates the compressor duty cycle, i.e., the percentage of the total operation time that the compressor was used to build air into the vehicle air system. A step S8-26 calculates the average build time required to reach the cut-out pressure. A step S8-27 determines the average unloaded time for the compressor, i.e., the average amount of time that passed between charge cycles of the compressor. A step S8-28 calculates the total air treated per cycle, i.e., the total air supplied from the compressor to the air dryer per each cycle of the compressor. A step S8-29 uses the total air treated number from step S8-28 and the total air used by each included device over the time of operation to determine the percentage of the total air used by each device.

Finally, a step S8-30 examines the duty cycle calculated by step S8-25. If the duty cycle is below a first threshold, the compressor and air dryer combination proposed by the user in step S2 is approved. If the duty cycle is above the first threshold, an extended purge air dryer is recommended. If the duty cycle is above a second threshold that is higher than the first threshold, but below a third, highest threshold, the customer is advised to use an additional filter upstream relative to the air dryer. Finally, if the duty cycle is above the third threshold, a larger capacity compressor/dryer combination will be recommended.

Figure 4:
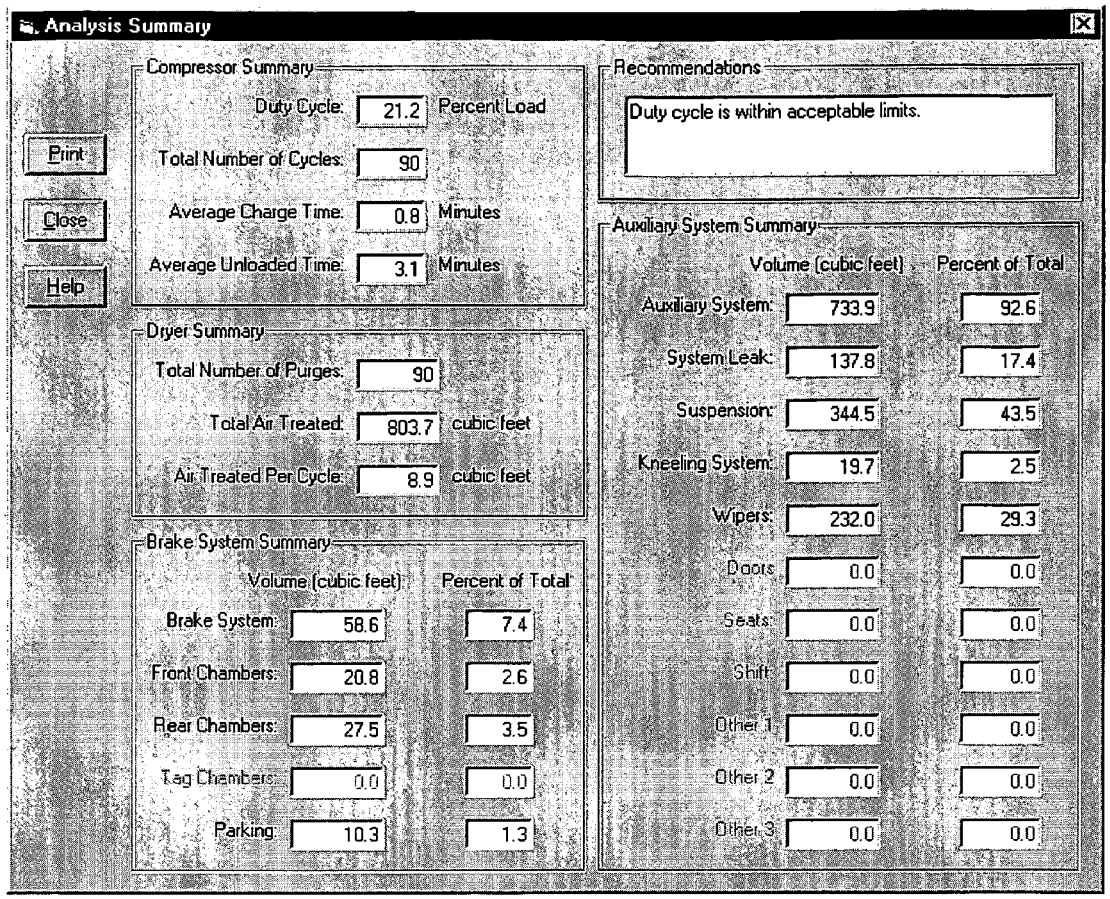

FIG. 4 is an example of a preferred output page that is displayed to a user on the video monitor 14 and printable to a user on the printer 20 to supply the user with all relevant information concerning the proposed vehicle air system as described above. In particular, as shown in FIG. 4, the preferred output page includes at least the information obtained from steps S8-25 through S8-30.

The invention has been described with reference to preferred embodiments. Obviously, modifications and alterations will occur to others upon reading and understanding the preceding specification. It is intended that the invention be construed as including all such modifications and alterations insofar as they fall within the scope of the following claims and equivalents.

Having thus described the preferred embodiments, what is claimed is:

1. A method of designing a vehicle air system comprising:
   (a) inputting vehicle use information that describes expected operation conditions of a proposed vehicle air system over a time period;
   (b) using a computer to simulate operation of said proposed vehicle air system over said time period, wherein said proposed vehicle air system comprises an air compressor and a pneumatically operable device, wherein said step of simulating operation of said proposed vehicle air system over a said time period includes: simulating selective operation of said air compressor to add air to said proposed vehicle air system; and simulating selective operation of said pneumatically operable device to exhaust air from said proposed vehicle air system at intervals that vary depending upon said inputted vehicle use information;

(c) using said computer to calculate a duty cycle of said air compressor over said time period and to output said duty cycle.

2. The method as set forth in claim 1, further comprising:
   (a) using said computer to compare said duty cycle to a predefined threshold; and
   (b) if said duty cycle exceeds said threshold, recommending modifications to said proposed vehicle air system.

3. The method as set forth in claim 1, wherein said time period is equal to an average period of time that said proposed vehicle air system is expected to be operated per day.

4. The method as set forth in claim 1, wherein said pneumatically operable device comprises a pneumatic suspension, and wherein said vehicle use information includes expected road roughness information.

5. The method as set forth in claim 1, wherein said pneumatically operable device comprises a pneumatic brake system, and said vehicle use information includes brake application pressure information.

6. The method as set forth in claim 1, wherein said pneumatically operable device comprises a pneumatic windshield wiper system, and wherein said vehicle use information comprises climate wetness information.

7. A method for predicting performance of a vehicle air system comprising:
   (a) inputting into a computer, data that simulate a proposed vehicle air system, wherein said inputted data describe a simulated: (i) air compressor; (ii) pneumatically operable device; and (iii) proposed use of a vehicle on which said proposed vehicle air system is to be used, wherein said simulated proposed use further includes data describing at least one of: road surface roughness, number of vehicle stops per day, number of parking brake applications per day; environmental wetness conditions encountered by said vehicle, number of gear shifts performed by said vehicle per day, number of door open/close cycles performed by said vehicle per day, and number of kneel cycles performed by said vehicle per day;
   (b) using said computer to simulate the operation of said proposed vehicle air system over a simulation time period, said simulated operation including: (i) selectively simulating exhaustion of air from said proposed vehicle air system in response to simulated operation of said pneumatically operable device; or (ii) selectively simulating addition of air to said proposed vehicle air system in response to simulated operation of said air compressor, and
   (c) outputting data from said computer that describe said simulated operation of said proposed vehicle air system.

8. The method as set forth in claim 7, wherein said step of outputting data comprises:
   (a) calculating a duty cycle that represents a percentage of said simulation time period that simulated operation of said air compressor is carried out to simulate addition of air to said proposed vehicle air system; and
   (b) outputting said duty cycle.

9. The method as set forth in claim 8, further comprising:
   (a) comparing said duty cycle to a predefined threshold; and
   (b) recommending modification of said proposed vehicle air system if said duty cycle exceeds said threshold.

10. The method as set forth in claim 8, wherein said step of inputting data that simulate a proposed vehicle air system includes inputting data that describe a plurality of simulated pneumatically operable devices of said proposed vehicle air system, and wherein said step of using said computer to simulate operation of said proposed vehicle air system over a simulation time period includes selectively simulating exhaustion of air from said proposed vehicle air system in response to simulated operation of said plurality of pneumatically operable devices, said method further comprising:
    (a) determining a total amount of air exhausted from said vehicle air system during said simulation time period;
    (b) determining the percentage of the total amount of air exhausted attributable to each of said plurality of pneumatically operable devices; and
    (c) for each of said plurality of pneumatically operable devices, displaying the percentage of the total amount of air exhausted attributable to that device.

11. The method as set forth in claim 7, wherein said step of inputting data further comprises: inputting data that describe a simulated air dryer of said proposed vehicle air system.

12. The method as set forth in claim 11, wherein said step of inputting data that describe a simulated pneumatically operable device comprises: inputting data that describe one of: a simulated air leak; a simulated pneumatic suspension; a simulated pneumatic kneeling apparatus; a simulated pneumatic windshield wiper system; a simulated pneumatic door system; a simulated pneumatic seat; and a simulated pneumatic gear shift apparatus.

13. The method as set forth in claim 7, wherein said step of inputting data that describe a simulated pneumatically operable device comprises:
    (a) inputting data that describe the amount of air used by said pneumatically operable device; and,
    (b) inputting data that describe the volume from which said pneumatically operable device receives air for operation.

14. A method for predicting vehicle air system performance comprising:
    (a) inputting data that describe a proposed vehicle air system including at least an air compressor and at least one pneumatically operable device;
    (b) receiving input data related to a capacity of the air compressor to supply air to the proposed vehicle air system;
    (c) receiving input data related to a cut-in pressure of said proposed vehicle air system below which said air compressor is considered operative to add air to said proposed vehicle air system;
    (d) receiving input data related to a cut-out pressure of said proposed vehicle air system above which operation of said air compressor to add air to said proposed vehicle air system is considered terminated;
    (e) receiving input data related to a usage rate at which said at least one pneumatically operable device depletes air from said proposed vehicle air system when said pneumatically operable device is considered to be in use;
    (f) receiving input data related to a frequency of operation of said pneumatically operable device, wherein said input data related to a frequency of operation of said pneumatically operable device further comprises at least one of climate information and road roughness information;
(g) determining a period of operation for the proposed vehicle air system;
(h) simulating operation of said proposed vehicle air system over said period of operation by:
(i) calculating data that represent air depleted from said proposed vehicle air system based upon the usage rate and frequency of operation of said at least one pneumatically operable device; and,
(ii) calculating data that represent air added to said proposed vehicle air system by said air compressor based upon the cut-in and cut-out pressures;
(i) recording data that represent a duration of time of said period of operation that said air compressor is considering to be adding air to said proposed vehicle air system; and,
(j) calculating data that describe a duty cycle of said air compressor, said duty cycle related to a percentage of time said air compressor is considered to be operated during said period of operation.

15. The method as set forth in claim 14, wherein said at least one pneumatically operable device is a brake system, and said step of receiving input data related to a frequency of operation of said pneumatically operable device comprises receiving information related to a frequency of break applications.

* * * * *